(12) United States Patent
Hukushima

(10) Patent No.: US 8,029,629 B2
(45) Date of Patent: Oct. 4, 2011

(54) SPUTTERING TARGET AND MANUFACTURING METHOD THEREOF

(75) Inventor: Atsushi Hukushima, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 201 days.

(21) Appl. No.: 12/617,966

(22) Filed: Nov. 13, 2009

(65) Prior Publication Data

US 2010/0058827 A1 Mar. 11, 2010

Related U.S. Application Data

(62) Division of application No. 10/492,310, filed as application No. PCT/JP02/07715 on Jul. 30, 2002, now abandoned.

(30) Foreign Application Priority Data

Nov. 26, 2001 (JP) ................................. 2001-358713

(51) Int. Cl.
*C21D 9/00* (2006.01)
*B21D 22/00* (2006.01)
(52) U.S. Cl. ........................................ 148/559; 72/352
(58) Field of Classification Search .................... 72/352; 148/559
See application file for complete search history.

(56) References Cited

U.S. PATENT DOCUMENTS

| | | | |
|---|---|---|---|
| 5,635,036 A | 6/1997 | Demaray et al. | |
| 5,687,600 A | 11/1997 | Emigh et al. | |
| 5,772,860 A | 6/1998 | Sawada et al. | |
| 6,045,634 A | 4/2000 | Annavarapu | |
| 6,210,502 B1 | 4/2001 | Takahashi | |
| 6,226,171 B1 | 5/2001 | Beilin et al. | |
| 6,283,357 B1 | 9/2001 | Kulkarni et al. | |
| 6,342,133 B2 | 1/2002 | D'Couto et al. | |
| 6,887,356 B2 | 5/2005 | Ford et al. | |
| 2005/0268999 A1 | 12/2005 | Oda | |
| 2007/0102288 A1 | 5/2007 | Oda et al. | |
| 2007/0108046 A1 | 5/2007 | Tsukamoto | |
| 2009/0057139 A1 | 3/2009 | Fukushima et al. | |

FOREIGN PATENT DOCUMENTS

| | | |
|---|---|---|
| JP | 06-010107 A | 1/1994 |
| JP | 2000-045067 A | 2/2000 |

OTHER PUBLICATIONS

Akifuma Mishima, "Application of High Purity Titanium to Sputtering Target", Titanium Japan, vol. 44, No. 2, pp. 84-87, 1996 (month unknown).

Ryo Suzuki et al., "Development Trend of Sputtering Materials", Denshi Zairyo, vol. 41, No. 7, pp. 44-48, Jul. 1, 2002.

*Primary Examiner* — Jessee R. Roe
(74) *Attorney, Agent, or Firm* — Howson & Howson LLP

(57) ABSTRACT

A sputtering target manufactured by die forging is provided. It is characterized in that an average crystal grain size D at a portion where an average crystal grain size is the largest and an average crystal grain size d at a portion where an average crystal grain size is the smallest are related as $1.0<D/d<2.0$. Further provided is a method capable of constantly manufacturing a sputtering target excellent in characteristics by improving and elaborating forging and heat treatment processes to render a crystal size fine and uniform, and a sputtering target excellent in quality obtained by this method.

16 Claims, 2 Drawing Sheets

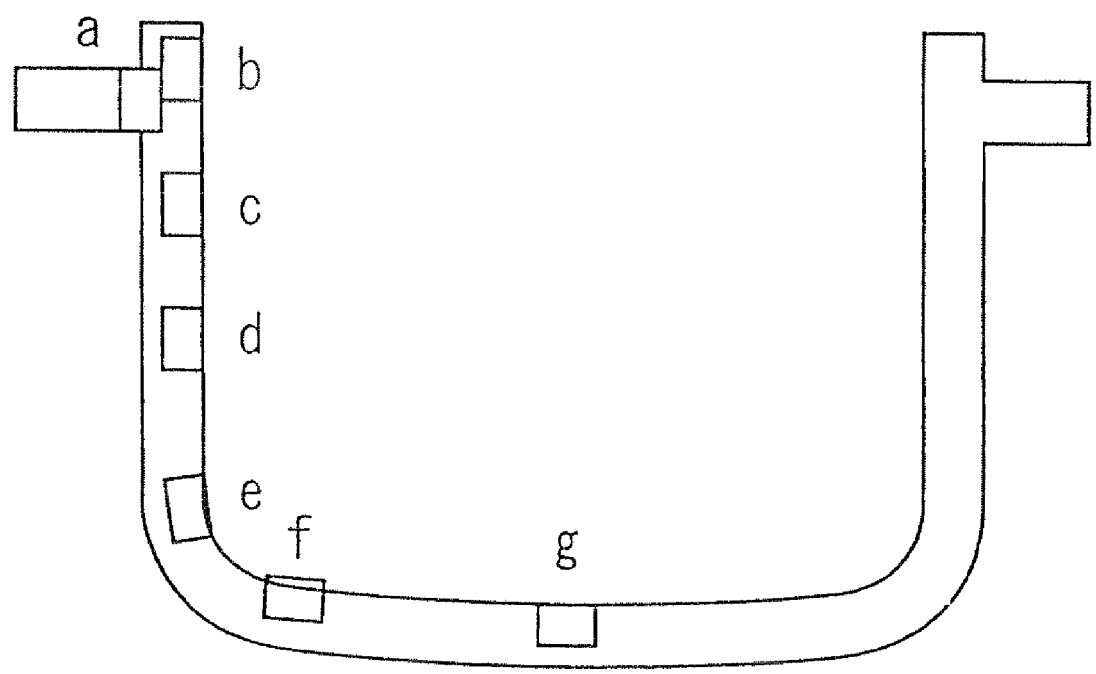

SPUTTERING TARGET AND MANUFACTURING METHOD THEREOF

CROSS REFERENCE TO RELATED APPLICATIONS

This application is a divisional of U.S. application Ser. No. 10/492,310 filed Apr. 12, 2004, now abandoned, which is the National Stage of International Application No. PCT/JP02/07715, filed Jul. 30, 2002, which claims the benefit under 35 USC §119 of Japanese Application No. 2001-358713, filed Nov. 26, 2001.

BACKGROUND OF THE INVENTION

The present invention pertains to a sputtering target having a complex three-dimensional (stereoscopic) structure formed by die forging, and the manufacturing method thereof.

In recent years, the sputtering method for forming a film from materials such as metal or ceramics has been used in numerous fields such as electronics, corrosion resistant materials and ornaments, catalysts, as well as in the manufacture of cutting/grinding materials and abrasion resistant materials.

Although the sputtering method itself is a well-known method in the foregoing fields, recently, particularly in the electronics field, a sputtering target suitable for forming films of complex shapes and forming circuits is in demand. For instance, a target having a three-dimensional (stereoscopic) structure in which the cross section is of a hat shape or dome shape, or a combination thereof is now being used.

Generally, a target having this kind of three-dimensional structure is manufactured by performing hot forging to an ingot or billet formed by dissolving and casting metal, thereafter performing annealing thereto, and further performing die forging thereto. In this kind of manufacturing procedure, the hot forging performed to the ingot or billet will destroy the cast structure, disperse or eliminate the pores and segregations, and, by further annealing this, recrystallization will occur, and the precision and strength of the structure can be improved to a certain degree.

Next, this forged, recrystallized and annealed material is formed into a target shape having a prescribed three-dimensional structure via die forging, and, thereafter, recrystallization annealing and straightening annealing are performed thereto and surface treatment is ultimately performed thereto in order to manufacture the target.

With this type of target manufacturing method, although there is no particular problem upon manufacturing an ordinary flat target, with a target having a three-dimensional (stereoscopic) structure in which the cross section is of a hat shape or dome shape, or the combination thereof, since there are portions that will be strongly subject to plastic deformation and portions that will hardly be subject to plastic deformation during die forging, there are cases where abnormal differences occur in the size of the crystal grains during the recrystallization annealing and straightening annealing thereafter.

For instance, although portions facing the forging direction will merely be subject to compressive force, portions along the forging direction; that is, the sidewall of the three-dimensional structure will be subject to harsh, strong processing.

As described above, the grain size of the recrystallized grains upon annealing will significantly differ at portions that are strongly subject to plastic deformation and portions that are weakly subject to plastic deformation. In other words, crystals become fine grains at portions that are strongly subject to plastic deformation, and crystals become coarse grains at portions that are weakly subject to plastic deformation. Further, the boundary area of such portions that are strongly and weakly subject to plastic deformation will become a crystal structure in which the fine grains and coarse grains exist at random, or in which the fine grains and coarse grains change in a phased manner.

Generally, upon performing sputtering, the finer the crystals of the target, the more even the deposition, and a film having even and stable characteristics, with few generation of arcing or particles, can be obtained.

Therefore, the existence of the foregoing coarse crystal grains and irregular crystal grains that generate during die forging or the annealing to be performed thereafter will increase the generation of arcing and particles, and there is a significant problem in that the quality of the sputtering film will deteriorate. Needless to say, it is not possible to consider using a stamp-forged product in which strain remains therein, and this will further deteriorate the quality.

In light of the above, there is a problem in that a sputtering target having a three-dimensional structure manufactured by die forging would deteriorate the film property pursuant to the crystal grains becoming coarse and uneven.

SUMMARY OF THE INVENTION

In order to overcome the foregoing problems, an object of the present invention is to provide a method capable of constantly manufacturing a sputtering target excellent in characteristics by improving and elaborating forging and heat treatment processes to render a crystal size fine and uniform, and a sputtering target excellent in quality obtained by this method.

The present invention provides a sputtering target manufactured by die forging, wherein the average crystal grain size D at a portion where an average crystal grain size is the largest and an average grain size d at a portion where an average crystal grain size is the smallest are related as 1.0<D/d<2.0.

The present invention also provides a hexagonal sputtering target of titanium or the like manufactured by die forging, wherein, in the erosion face of the target, the total intensity ratio of the (002) face, and the (103) face, (014) face and (015) face within a 30° angle thereof is 30% or more, and the variation is within ±10% of the average value.

The sputtering targets referenced above can have a ratio of the opening diameter and depth of one or more hat shapes or dome shapes appearing in the diametrical cross section of 1:3 or less.

The present invention also provides a manufacturing method of a sputtering target by die forging, comprising the steps of performing hot kneading or cold kneading and straightening annealing to an ingot or billet material, adjusting the crystal grains by performing cold performing and recrystallization annealing, and thereafter performing die forging.

The present invention also provides a manufacturing method of a hexagonal sputtering target of titanium or the like manufactured by die forging as described above, wherein, in the erosion face of the target, the total intensity ratio of the (002) face, and the (103) face, (014) face and (015) face within a 30° angle thereof is 30% or more, and the variation is within ±10% of the average value.

In the manufacturing method, the total absolute value of the true strain in hot kneading or cold kneading can be 4 or more, and when the melting point of the material is Tm, die forging can be performed at 0.5 Tm or less. Also, straightening annealing or recrystallization annealing can be performed after die forging, and when the melting point of the material is Tm, recrystallization annealing after the cold preforming can be performed at 0.6Tm or less. Further, when the melting point of the material is Tm, straightening annealing or recrystallization annealing can be performed at 0.6Tm or less after die forging.

In the manufacturing method, cold preforming can be at a processing ratio of 20 to 90%, and as a result of performing recrystallization annealing after cold preforming, the average crystal grain size $D_0$ at a portion where an average crystal grain size is the largest and an average grain size $d_0$ at a portion where an average crystal grain size is the smallest are related as $1.0<D_0/d_0<1.5$. Also, as a result of performing recrystallization annealing after cold preforming, the grain size can be made to be 200% or less of the ultimate average crystal grain size. Further, as a result of performing crystal homogenization annealing or straightening annealing after die forging, the average crystal grain size can be made to be in a range of 1 to 500 µm.

In the manufacturing method, the average crystal grain size D at a portion where an average crystal grain size is the largest and an average grain size d at a portion where an average crystal grain size is the smallest can be related as $1.0<D/d<2.0$. The target material can be copper, titanium, aluminum, nickel, cobalt, tantalum, or the alloys thereof.

BRIEF DESCRIPTION OF THE DRAWINGS

FIG. 3 is a diagram showing the measurement position of the face orientation.

DETAILED DESCRIPTION OF THE INVENTION

Figure 1:
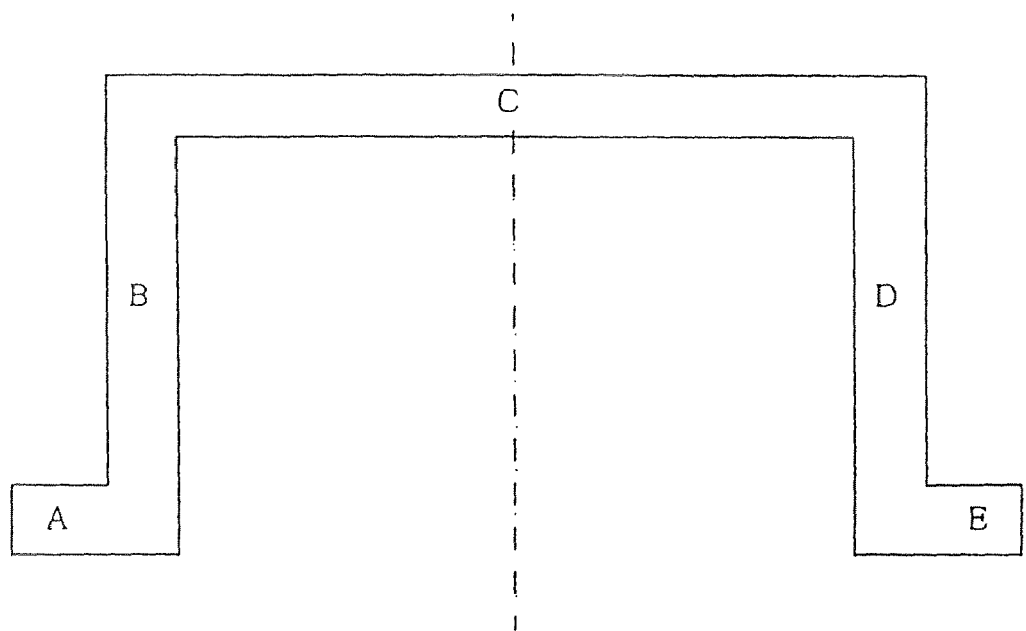
FIG. 1 is an explanatory diagram showing the structure of a target stamp forged into a hat shaped target.

The sputtering target of the present invention is manufactured with the following steps. Specifically, foremost, a metal material such as copper, titanium, aluminum, nickel, cobalt, tantalum, or the alloys thereof is dissolved and cast to manufacture an ingot or billet. Next, this ingot or billet is subject to hot forging or cold forging and straightening annealing.

As a result of this forging, it is possible to destroy this cast structure and disperse or eliminate the pores or segregations. Annealing is further performed thereto for realizing recrystallization, and the hot forging or cold forging and recrystallization annealing processes are able to improve the fineness and strength of the structure.

As the foregoing hot and cold forging, it is preferable to perform knead forging (kneading), and the repetition of hot or cold forging is effective in improving the characteristics. Further, although the recrystallization temperature will differ depending on the metal, the optimum temperature is determined in consideration of the amount of strain, as well as temperature and time.

In the foregoing hot kneading or cold kneading, it is desirable that the total absolute value of the true strain is 4 or more. This condition is particularly effective when forging tantalum.

Next, cold preforming is performed. When the melting point of the material is Tm, this cold performing is controlled to be 0.3Tm or less, preferably 0.2Tm or less.

Further, although the degree of processing will differ depending on the ultimately demanded crystal grain size, it is preferable that the degree of processing is 20% or more. It is particularly preferable to perform processing at a processing ratio of 50 to 90%. Thereby, intense processing strain can be yielded in the material.

As described above, the reason for performing cold preforming is to introduce a larger processing strain, and to maintain a fixed temperature of the material during the preforming step as much as possible. As a result, the stain to be introduced can be enlarged sufficiently, and be made uniform.

After performing cold preforming, the crystal grain size is adjusted by performing recrystallization annealing. When the melting point of the material is Tm, it is desirable that this recrystallization annealing after the cold preforming is performed at 0.6Tm or less, preferably 0.4Tm or less.

As a result, the average crystal grain size $D_0$ at a portion where an average crystal grain size is the largest and an average grain size $d_0$ at a portion where an average crystal grain size is the smallest will be related as $1.0<D_0/d_0<1.5$.

Cold preforming is an important step in the present invention, and, with this, it is possible to obtain a target having fine and uniform crystals in the final step.

Next, this cold preformed material having fine and uniform crystals is subject to die forging. Here, spinning processing is included in the die forging. In other words, spinning processing shall be included in every die forging described in this specification.

Further, after die forging, crystal homogenization annealing or straightening annealing is performed in order to make the average crystal grain size to be within a range of 1 to 500 µm.

In this die forging, there will be portions that are strongly subject to the foregoing strain, and portions that are hardly subject to such strain. Nevertheless, with the portions weakly subject to the strain, since the crystal grains have been adjusted to be fine in the prior cold preforming step, there will not be a significant difference in the crystal grain size in comparison with the other portions strongly subject to the strain.

According to the above, as a result of performing crystal homogenization annealing or straightening annealing after die forging, the internal strain can be eliminated, and a target having an overall approximately uniform crystal grain size can be obtained. And, a sputtering target in which the average crystal grain size D at a portion where an average crystal grain size is the largest and an average grain size d at a portion where an average crystal grain size is the smallest will be related as $1.0<D/d<2.0$ can be obtained.

Moreover, with a hexagonal sputtering target of titanium in particular, it is possible to obtain a sputtering target wherein, in the erosion face of the target, the total intensity ratio of the (002) face, and the (103) face, (014) face and (015) face within a 30° angle against such (002) face is 30% or more, and the variation is within ±10% of the average value. This type of face orientation centered around the (002) face is effective in realizing uniform sputtering, and yields evenness in the deposition.

EXAMPLES AND COMPARATIVE EXAMPLES

The present invention is now explained in detail with reference to the Examples. These Examples are merely illustrative, and the present invention shall in no way be limited thereby. In other words, the present invention shall only be limited by the scope of claim for a patent, and shall include the various modifications other than the Examples of this invention.

Although the following Examples and Comparative Examples are exemplified taking pure copper and pure titanium as examples, similar results were obtained with aluminum, nickel, cobalt, tantalum, and the alloys thereof.

Example 1

A copper (6N) material was dissolved and cast to prepare an ingot. Next, this ingot was subject to hot kneading at 800° C. This hot kneading destroyed the cast structure, as well as dispersed and eliminated pores and segregations, and a forged product having a uniform structure was obtained thereby.

Next, using this hot kneaded material, preforming was performed at room temperature and a processing ratio of 50%. After performing this preforming step, recrystallization annealing was performed at 300° C. for 2 hours in order to adjust the crystal grains. As a result, it was possible to adjust the average crystal grain size to be a fine and uniform crystal grain size of 85 μm.

The preformed material having this kind of fine and uniform crystals was stamp forged into a hat shaped target. Die forging was performed at 280° C. After die forging, crystal grain homogenization annealing and straightening annealing were performed at 300° C. for 2 hours.

FIG. 1 is a cross section of the hat shaped target prepared in the foregoing step. Symbol C in FIG. 1 represents the hat ceiling portion, A and E represent the flange portion, B and D represent the side portion, and all of these portions are on the target side (side subject to erosion upon sputtering).

The average grain size was respectively A: 91 μm, B: 86 μm, C: 112 μm, D: 79 μm and E: 92 μm, and it was possible to prepare a target having a uniform grain size in which the ratio D/d of an average crystal grain size D at a portion where an average crystal grain size is the largest and an average grain size d at a portion where an average crystal grain size is the smallest realizes D/d=1.46.

The foregoing results are shown together with the following Comparative Examples in Table 1.

In die forging, as described above, there will be portions that are strongly subject to the strain and portions that are hardly subject to the strain. In the present method, the portions strongly subject to the strain during die forging will generate recrystallization and grain growth in the subsequent crystal grain homogenization annealing step. Thus, appropriate crystal grain homogenization annealing conditions were established so as to align the grain size at the foregoing step to the grain size after the cold preforming and recrystallization annealing steps.

Moreover, in portions that are not strongly subject to the strain, the crystal gram size has been adjusted to be fine in the prior cold preforming and recrystallization annealing steps. Thus, so as long as the annealing of the present invention is performed, it is possible to avoid significant differences in the crystal grain size in portions strongly subject to strain and portions weakly subject to strain without having to encounter considerable grain growth.

The X-ray diffraction intensity ratio I(111)/I(200) of the (111) face and (200) face in the erosion face of the copper, hat shaped target was sought. Further, the measured portions are the respective measurement positions depicted in FIG. 3. Further, similar to the case of Example 2 described later, the orientation intensity ratio in a case of comparing this with a random orientation is also shown.

As a result of measurement, with position a: 2.6, position b: 2.7, position c: 2.9, position d: 2.5, position e: 2.6, and position f: 2.5, the positions oriented toward (111) greater than random orientation I*(111)/I*(200)=2.08, and significant variations in the orientation could not be seen in any of the positions. As a result, it is evident that the uniformity of the target was retained thereby.

Comparative Example 1

Similar to Example 1, a copper (6N) material was dissolved and cast to prepare an ingot. Next, this ingot was subject to cold kneading, cold preforming was performed at a processing ratio of 50%, and recrystallization annealing was further performed at 300° C. for 2 hours. This preformed material was similarly stamp forged into a hat shaped target at 400° C.

After die forging, crystal grain homogenization annealing and straightening annealing were performed at 425° C. The average crystal grain size of portions A to E at such time is similarly shown in Table 1.

Similarly, symbol C represents the hat ceiling portion, A and E represent the flange portion, B and D represent the side portion, and all of these portions are on the target side (side subject to erosion upon sputtering).

The average grain size was respectively A: 344 μm, B: 184 μm, C: 211 μm, D: 192 μm and E: 379 μm, and coarse on the whole. Thus, obtained was a target having uneven grain sizes in which the ratio D/d of an average crystal grain size D at a portion where an average crystal grain size is the largest and an average grain size d at a portion where an average crystal grain size is the smallest became D/d=2.06.

The enlargement of the average grain size and unevenness of the grain size could be considered a result of the die forging temperature and annealing temperature after such die forging being too high.

Comparative Example 2

Similar to Example 1, a copper (6N) material was dissolved and cast to prepare an ingot. Next, this ingot was subject to preforming with hot forging at 750° C. As with Example 1, this preformed material was stamp forged into a hat shaped target at 280° C., and, after such die forging, crystal grain homogenization annealing and straightening annealing were performed at 300° C. for 2 hours. The average crystal grain size of portions A to E at such time is similarly shown in Table 1. Here, the recrystallization annealing subsequent to the preforming step was not performed.

Similarly, symbol C represents the hat ceiling portion, A and E represent the flange portion, B and D represent the side portion, and all of these portions are on the target side (side subject to erosion upon sputtering).

The average grain size was respectively A: 724 μm, B: 235 μm, C: 257 μm, D: 244 μm and E: 773 μm, and even more coarse on the whole. Thus, obtained was a target having further uneven grain sizes in which the ratio D/d of an average crystal grain size D at a portion where an average crystal grain size is the largest and an average crystal grain size d at a portion where an average crystal grain size is the smallest became D/d=3.29.

The enlargement of the average grain size and unevenness of the grain size could be considered a result of insufficient processing since cold preforming was not performed, and because recrystallization annealing subsequent to preforming was not performed.

Comparative Example 3

Similar to Example 1, a copper (6N) material was dissolved and cast to prepare an ingot. Next, this ingot was subject to preforming with hot forging at 750° C. This preformed material was similarly stamp forged into a hat shaped target at 650° C., and, after such die forging, crystal grain homogenization annealing and straightening annealing were performed at 700° C. for 2 hours. The average crystal grain size of portions A to E at such time is similarly shown in Table 1. Here, the recrystallization annealing subsequent to the preforming step was not performed.

Similarly, symbol C represents the hat ceiling portion, A and E represent the flange portion, B and D represent the side portion, and all of these portions are on the target side (side subject to erosion upon sputtering).

The average grain size was respectively A: 2755 µm, B: 654 µm, C: 775 µm, D: 688 µm and E: 2911 µm, and abnormally coarse on the whole. Thus, obtained was a target having significant uneven grain sizes in which the ratio D/d of an average crystal grain size D at a portion where an average crystal grain size is the largest and an average grain size d at a portion where an average crystal grain size is the smallest became D/d=4.45.

The enlargement of the average grain size and unevenness of the grain size could be considered a result of insufficient processing since cold preforming was not performed, and because the die forging temperature was too high.

Comparative Example 4

Similar to Example 1, a copper (6N) material was dissolved and cast to prepare an ingot. Next, this ingot was subject to preforming with hot forging at 400° C. As with Example 1, this preformed material was stamp forged into a hat shaped target at 280° C., and, after such die forging, crystal grain homogenization annealing and straightening annealing were performed at 300° C. for 2 hours. The average crystal grain size of portions A to E at such time is similarly shown in Table 1. Here, the recrystallization annealing subsequent to the preforming step was not performed.

Similarly, symbol C represents the hat ceiling portion, A and E represent the flange portion, B and D represent the side. portion, and all of these portions are on the target side (side subject to erosion upon sputtering).

The average grain size was respectively A: 121 µm, B: 88 µm, C: 308 µm, D: 105 µm and E: 122 µm, and relatively fine on the whole. Nevertheless, center portion C became coarse, and obtained was a target having uneven grain sizes in which the ratio D/d of an average crystal grain size D at a portion where an average crystal grain size is the largest and an average grain size d at a portion where an average crystal grain size is the smallest became D/d=3.50.

The enlargement of the average grain size and unevenness of the grain size could be considered a result of insufficient processing since cold preforming was not performed.

TABLE 1

| | | | Die | | Average Crystal Grain Size (µm) | | | | | |
| | Preforming | Recrystallization | Forging | Annealing | A | B | C | D | E | D/d |
| --- | --- | --- | --- | --- | --- | --- | --- | --- | --- | --- |
| Example 1 | Cold | 300° C. | 280° C. | 300° C. | 91 | 86 | 112 | 79 | 92 | 1.42 |
| Comparative Example 1 | Cold | 300° C. | 400° C. | 425° C. | 344 | 184 | 211 | 192 | 379 | 2.06 |
| Comparative Example 2 | 750° C. | — | 280° C. | 300° C. | 724 | 235 | 257 | 244 | 773 | 3.29 |
| Comparative Example 3 | 750° C. | — | 650° C. | 700° C. | 2755 | 654 | 775 | 688 | 2911 | 4.45 |
| Comparative Example 4 | 400° C. | — | 280° C. | 300° C. | 121 | 88 | 308 | 105 | 122 | 3.50 |

Example 2

A titanium (4N5) material was dissolved and cast to prepare an ingot. Next, this ingot was subject to cylindrical forging at 650° C. to prepare a billet. Here, the total absolute value of the true strain was 4.

Next, using this billet, preforming was performed at room temperature and a processing ratio of 50%. After performing this preforming step, recrystallization annealing was performed at 500° C. for 2 hours in order to adjust the crystal grains. As a result, it was possible to adjust the average crystal grain size to be a fine and uniform crystal grain size of 35 µm.

The cold preformed material having this kind of fine and uniform crystals was stamp forged into a hat shaped target. Die forging was performed at 450° C. After die forging, crystal grain homogenization annealing and straightening annealing were performed at 500° C. for 2 hours.

Since the cross section of the hat shaped target prepared in the foregoing step is the same as FIG. 1, the following explanation will be made with reference to FIG. 1. Symbol C in FIG. 1 represents the hat ceiling portion, A and E represent the flange portion, B and D represent the side portion, and all of these portions are on the target side (side subject to erosion upon sputtering).

The average grain size was respectively A: 37 µm, B: 31 µm, C: 34 µm, D: 29 µm and E: 39 µm, and it was possible to prepare a target having a uniform grain size in which the ratio D/d of an average crystal grain size D at a portion where an average crystal grain size is the largest and an average grain size d at a portion where an average crystal grain size is the smallest realizes D/d=1.35.

The foregoing results are shown together with the following Comparative Examples in Table 2.

Moreover, the total intensity ratio of the (002) face in the erosion face of the hat shaped target, and the (103) face, (014) face and (015) face within a 30° angle thereof was sought (here, this shall be the (002) face orientation rate). Further, the measured portions are the respective measurement positions depicted in FIG. 3 described later.

The intensity ratio was sought as follows. I(hkl) is the intensity of the diffraction peak of the (hkl) face sought with X-ray diffraction. I*(hkl) is the relative intensity (meaning the intensity when the orientation is entirely random) of the JCPDS (Joint Committee of Diffraction Standard) card. Therefore, I(hkl)/I*(hkl) shows the normalized orientation intensity of the (hkl) face in comparison to the random orientation.

Σ[I(hkl)/I*(hkl)] is the total normalized intensity ratio. Therefore, the (002) face orientation rate can be calculated with:

[I(002)/I*(002)+I(103)/I*(103)+I(014)/I*(014)+I(015)/I*(015)]/Σ[I(hkl)/I*(hkl)].

From the above, as a result of measuring the face orientation in the measurement position b of FIG. 3, intensity ratio 6.3% of the (002) face, intensity ratio 9.9% of the (103) face, intensity ratio 8.2% of the (014) face, and intensity ratio 7.3% of the (015) face were obtained, and the total intensity ratio was 34.3%.

Similarly, results of the total intensity ratio measured respectively at the positions of a, b (as indicated above), c, d, e, f and g of the hat shaped target illustrated in FIG. 3 were as follows: position a: 34.3%, position b (as indicated above): 34.3%, position c: 44.0%, position d: 43.2%, position e: 44.9%, position f: 37.1% and position g: 43.3%. From the above, the total intensity ratio of the (002) face, and the (103) face, (014) face and (015) face within a 30° angle against this (002) face at the respective positions was 40±10%, and a favorable target having minimal variations in the orientation and superior evenness was obtained thereby.

Comparative Example 5

As with Example 2, a cylindrical forged billet was used to perform cold preforming at a processing ratio of 50%. This preformed material was stamp forged into a target at 700° C., and, after die forging, crystal grain homogenization annealing and straightening annealing were performed at 750° C. The average crystal grain size of portions A to E at such time is similarly shown in Table 2.

Similarly, symbol C represents the hat ceiling portion, A and E represent the flange portion, B and D represent the side portion, and all of these portions are on the target side (side subject to erosion upon sputtering).

The average grain size was respectively A: 346 μm, B: 140 μm, C: 199 μm, D: 156 μm and E: 325 μm, and coarse on the whole. Thus, obtained was a target having uneven grain sizes in which the ratio Did of an average crystal grain size D at a portion where an average crystal grain size is the largest and an average grain size d at a portion where an average crystal grain size is the smallest became D/d=2.47.

The enlargement of the average grain size and unevenness of the grain size could be considered a result of the die forging temperature and recrystallization annealing temperature after such die forging being too high.

Comparative Example 6

As with Example 2, a cylindrical forged billet was used to perform hot preforming at 500° C. As with Comparative Example 2, this preformed material was stamp forged into a hat shaped target at 450° C., and, after die forging, crystal grain homogenization annealing and straightening annealing were performed at 500° C. The average crystal grain size of portions A to E at such time is similarly shown in Table 2. Here, the recrystallization annealing subsequent to the preforming step was not performed.

Similarly, symbol C represents the hat ceiling portion, A and E represent the flange portion, B and D represent the side portion, and all of these portions are on the target side (side subject to erosion upon sputtering).

The average grain size was respectively A: 124 μm, B: 45 μm, C: 66 μm, D: 53 μm and E: 133 μm, and relatively fine on the whole. Nevertheless, flange portions A and E became coarse, and obtained was a target having uneven grain sizes in which the ratio D/d of an average crystal grain size D at a portion where an average crystal grain size is the largest and an average grain size d at a portion where an average crystal grain size is the smallest became D/d=2.96.

The enlargement of the average grain size and unevenness of the grain size could be considered a result of insufficient processing since cold preforming was not performed, and because recrystallization annealing subsequent to cold preforming was not performed.

Comparative Example 7

As with the Examples, a cylindrical forged billet was used to perform hot preforming at 750° C. This preformed material was stamp forged into a hat shaped target at 450° C., and, after die forging, crystal grain homogenization annealing and straightening annealing were performed at 500° C. The average crystal grain size of portions A to E at such time is similarly shown in Table 2. Here, the recrystallization annealing subsequent to the preforming step was not performed.

Similarly, symbol C represents the hat ceiling portion, A and E represent the flange portion, B and D represent the side portion, and all of these portions are on the target side (side subject to erosion upon sputtering).

The average grain size was respectively A: 156 μm, B: 56 μm, C: 87 μm, D: 61 μm and E: 177 μm, and was coarser than Comparative Example 6. Thus, obtained was a target having uneven grain sizes in which the ratio D/d of an average crystal grain size D at a portion where an average crystal grain size is the largest and an average grain size d at a portion where an average crystal grain size is the smallest became D/d=2.90.

The enlargement of the average grain size and unevenness of the grain size could be considered a result of insufficient processing since cold preforming was not performed, and because recrystallization annealing subsequent to cold preforming was not performed.

TABLE 2

| | | | Die | | Average Crystal Grain Size (μm) | | | | | |
|---|---|---|---|---|---|---|---|---|---|---|
| | Preforming | Recrystallization | Forging | Annealing | A | B | C | D | E | D/d |
| Example 2 | Cold | 500° C. | 450° C. | 500° C. | 37 | 31 | 34 | 29 | 39 | 1.35 |
| Comparative Example 5 | Cold | 500° C. | 700° C. | 750° C. | 346 | 140 | 199 | 156 | 325 | 2.47 |
| Comparative Example 6 | 500° C. | — | 450° C. | 500° C. | 124 | 45 | 66 | 53 | 133 | 2.96 |
| Comparative Example 7 | 750° C. | — | 450° C. | 500° C. | 156 | 56 | 87 | 61 | 177 | 2.90 |

Example 3

A copper (6N) material was dissolved and cast to prepare an ingot. Next, this ingot was subject to hot kneading at 800° C. This hot kneading destroyed the cast structure, as well as dispersed and eliminated pores and segregations, and a forged product having a uniform structure was obtained thereby.

Next, using this hot kneaded material, preforming was performed at room temperature and a processing ratio of 50%. After performing this preforming step, recrystallization annealing was performed at 300° C. for 2 hours in order to adjust the crystal grains. As a result, it was possible to adjust the average crystal grain size to be a fine and uniform crystal grain size of 85 μm.

The preformed material having this kind of fine and uniform crystals was stamp forged into a target shape in which the cross section thereof appears to be a connection of two hat shaped targets. Die forging was performed at 280° C. After die forging, crystal grain homogenization annealing and straightening annealing were performed at 300° C. for 2 hours.

Figure 2:
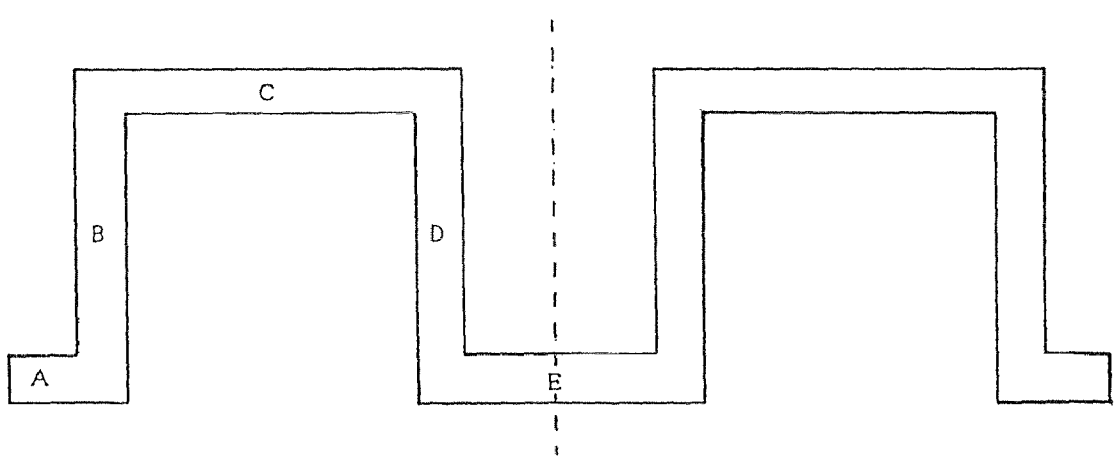
FIG. 2 is an explanatory diagram showing the structure of a target stamp forged into a shape in which the cross section thereof appears to be a connection of two hat shaped targets.

FIG. 2 is a cross section of the target prepared in the foregoing step. Symbol C in FIG. 2 represents the hat ceiling portion, A represents the flange portion, B and D represent the side portion, E represents the hat connection portion, and all of these portions are on the target side (side subject to erosion upon sputtering).

The average grain size was respectively A: 100 μm, B: 94 μm, C: 118 μm, D: 94 μm and E: 92 μm, and it was possible to prepare a target having a uniform grain size in which the ratio D/d of an average crystal grain size D at a portion where an average crystal grain size is the largest and an average grain size d at a portion where an average crystal grain size is the smallest realizes D/d=1.28.

The foregoing results are shown together with the following the Comparative Example in Table 3.

Comparative Example 8

Similar to Example 3, a copper (6N) ingot was prepared. This ingot was then subject to preforming via hot forging at 400° C. Similar to Example 4, this preformed material was stamp forged into a target shape in which the cross section thereof appears to be a connection of two hat shaped targets. After die forging, crystal grain homogenization annealing and straightening annealing were performed at 300'C.

The average crystal grain size of portions A to E at such time is similarly shown in Table 3. Here, the recrystallization annealing subsequent to the preforming step was not performed.

Similarly, symbol C represents the hat ceiling portion, A represents the flange portion, B and D represent the side portion, E represents the hat connection portion, and all of these portions are on the target side (side subject to erosion upon sputtering).

The average grain size was respectively A: 127 μm, B: 123 μm, C: 278 μm, D: 101 μm and E: 113 μm, and relatively fine on the whole. Nevertheless, center portion C became coarse, and obtained was a target having uneven grain sizes in which the ratio D/d of an average crystal grain size D at a portion where an average crystal grain size is the largest and an average grain size d at a portion where an average crystal grain size is the smallest became D/d=2.46. The enlargement of the average grain size and unevenness of the grain size could be considered a result of insufficient processing since cold preforming was not performed.

Example 4

A tantalum (5N) material was dissolved and EB cast to prepare an ingot. Next, this ingot was repeatedly subject to kneading at room temperature and straightening annealing at 1200° C., and a billet in which the total absolute value of the true strain is 8 was prepared.

Next, using this billet, rolling preforming was performed at room temperature and a processing ratio of 70%. After performing this preforming step, recrystallization annealing was performed at 900° C. for 2 hours in order to adjust the crystal grains. As a result, it was possible to adjust the average crystal grain size to be a fine and uniform crystal grain size of 75 μm.

The preformed material having this kind of fine and uniform crystals was subject to spinning processing so as to form a target shape in which the cross section thereof appears to be a connection of two hat shaped targets. Spinning processing was performed at room temperature. Thereafter, crystal grain homogenization annealing and straightening annealing were performed at 925° C. for 2 hours.

Since the cross section of the connected hat shaped target prepared in the foregoing step is the same as FIG. 2, the following explanation will be based on FIG. 1. Symbol C in FIG. 1 represents the hat ceiling portion, A represents the flange portion, B and D represent the side portion, E represents the hat connection portion, and all of these portions are on the target side (side subject to erosion upon sputtering).

The average grain size was respectively A: 87 μm, B: 76 μm, C: 71 μm, D: 82 μm and E: 80 μm, and it was possible to prepare a target having a uniform grain size in which the ratio D/d of an average crystal grain size D at a portion where an average crystal grain size is the largest and an average grain size d at a portion where an average crystal grain size is the smallest realizes D/d=1.23.

The foregoing results are shown together with the following Comparative Example in Table 4.

TABLE 3

| | | | Die | | Average Crystal Grain Size (μm) | | | | | |
| --- | --- | --- | --- | --- | --- | --- | --- | --- | --- | --- |
| | Preforming | Recrystallization | Forging | Annealing | A | B | C | D | E | D/d |
| Example 3 | Cold | 300° C. | 280° C. | 300° C. | 100 | 94 | 118 | 96 | 92 | 1.28 |
| Comparative Example 8 | 400° C. | — | 280° C. | 300° C. | 127 | 123 | 278 | 101 | 113 | 2.46 |

TABLE 4

| | Knead Forging Ratio | Preforming | Recrystallization | Die Forging | Annealing | A | B | C | D | E | D/d |
|---|---|---|---|---|---|---|---|---|---|---|---|
| Example 4 | 8 | Cold | 900° C. | Room Temp. | 925° C. | 87 | 76 | 71 | 82 | 80 | 1.23 |
| Comparative Example 9 | Less than 4 | Cold | 900° C. | Room Temp. | 925° C. | 89 | 147 | 78 | 72 | 88 | 2.04 |

Comparative Example 9

Similar to Example 4, a tantalum (5N) material was dissolved and EB cast to prepare an ingot. Next, this ingot was subject to forging at room temperature so as to prepare a billet. Here, the total absolute value of the true strain was 4 or less.

Next, using this billet, rolling preforming was performed at room temperature and a processing ratio of 70%. After performing this preforming step, recrystallization annealing was performed at 900° C. for 2 hours, but the average crystal grain size varied depending on the location, and was between 80 to 150 μm.

The cold rolled, preformed material was subject to spinning processing so as to form a target shape in which the cross section thereof appears to be a connection of two hat shaped targets. Spinning processing was performed at room temperature. Thereafter, crystal grain homogenization annealing and straightening annealing were performed at 925° C. for 2 hours.

Similarly, symbol C represents the hat ceiling portion, A represents the flange portion, B and D represent the side portion, E represents the hat connection portion, and all of these portions are on the target side (side subject to erosion upon sputtering).

The average grain size was respectively A: 89 μm, B: 147 μm, C: 78 μm, D: 72 μm and E: 88 μm, and only one side; namely, sidewall B became coarse, and obtained was a target having uneven grain sizes in which the ratio D/d of an average crystal grain size D at a portion where an average crystal grain size is the largest and an average grain size d at a portion where an average crystal grain size is the smallest became D/d=2.04.

The partial enlargement of the crystal grain size could be considered a result of insufficient kneading at the time of knead forging. As a result, the cast primary crystals could not be completely destroyed, and the target was formed into its final shape while retaining the distribution of the primary crystals.

The present invention provides a manufacturing method of a sputtering target having a three-dimensional structure by die forging, and is characterized in that an average crystal grain size D at a portion where an average crystal grain size is the largest and an average crystal grain size d at a portion where an average crystal grain size is the smallest are related as $1.0<D/d<2.0$. As a result, a superior effect is yielded in that it is possible to suppress the generation of arcing and particles during sputtering, and obtain a film having uniform and stable characteristics.

The invention claimed is:

1. A method of manufacturing a sputtering target, comprising the steps of:
performing hot or cold kneading and straightening annealing to an ingot or billet material;
adjusting crystal grains of the material by performing cold preforming and recrystallization annealing;
thereafter performing die forging; and
after said die forging step, performing straightening or recrystallization annealing.

2. A method according to claim 1, wherein the sputtering target produced by the method is a hexagonal sputtering target having an erosion face with a total intensity ratio of a (002) face, and a (103) face, (014) face and (015) face within a 30° angle thereof of 30% or more, and variation is within ±10% of an average value.

3. A method according to claim 2, wherein the sputtering target is made of titanium.

4. A method according to claim 1, wherein a total absolute value of true strain in said hot or cold kneading is 4 or more.

5. A method according to claim 4, wherein the material has a melting point of Tm, and said die forging step is performed at a temperature of 0.5Tm or less.

6. A method according to claim 5, wherein said recrystallization annealing step performed after said cold preforming step and said straightening or recrystallization annealing step performed after said die forging step are performed at a temperature of 0.6Tm or less.

7. A method according to claim 6, wherein said cold preforming step is performed at a processing ratio of 20 to 90%.

8. A method according to claim 1, wherein said material has a melting point of Tm and said die forging step is performed at a temperature of 0.5Tm or less.

9. A method according to claim 1, wherein said material has a melting point of Tm and said recrystallization annealing step performed after said cold preforming is performed at a temperature of 0.6Tm or less.

10. A method according to claim 1, wherein said material has a melting point of Tm and said straightening or recrystallization annealing step performed after said die forging step is performed at a temperature of 0.6Tm or less.

11. A method according to claim 1, wherein said cold preforming step is performed at a processing ratio of 20 to 90%.

12. A method according to claim 1, wherein, as a result of performing recrystallization annealing after cold preforming, an average crystal grain size $D_0$ at a portion of said target where an average crystal grain size is largest and an average grain size $d_0$ at a portion of said target where an average crystal grain size is smallest are related as $1.0<D_0/d_0<1.5$.

13. A method according to claim 1, wherein, as a result of performing recrystallization annealing after cold preforming, a grain size of said material is 200% or less of an ultimate average crystal grain size of said target.

14. A method according to claim 1, wherein, as a result of performing straightening or recrystallization annealing after die forging, an average crystal grain size of said target is in a range of 1 to 500 μm.

15. A method according to claim 1, wherein an average crystal grain size D at a portion of said target where an average crystal grain size is largest and an average grain size d at a portion where an average crystal grain size is smallest are related as $1.0<D/d<2.0$.

16. A method according to claim 1, wherein said target is made of a material selected from a group consisting of copper, titanium, aluminum, nickel, cobalt, tantalum, and alloys thereof.

* * * * *

UNITED STATES PATENT AND TRADEMARK OFFICE
CERTIFICATE OF CORRECTION

PATENT NO.       : 8,029,629 B2                             Page 1 of 1
APPLICATION NO.  : 12/617966
DATED            : October 4, 2011
INVENTOR(S)      : Atsushi Hukushima It is certified that error appears in the above-identified patent and that said Letters Patent is hereby corrected as shown below:

Column 9, line 40 "Did" should read "D/d".

Column 11, line 29 "94" should read "96".

Signed and Sealed this
Seventeenth Day of April, 2012

David J. Kappos
*Director of the United States Patent and Trademark Office*